US008623703B2

(12) United States Patent
Takahashi et al.

(10) Patent No.: US 8,623,703 B2
(45) Date of Patent: Jan. 7, 2014

(54) SILICON DEVICE AND SILICON DEVICE MANUFACTURING METHOD

(75) Inventors: Shin Takahashi, Suwa (JP); Junichi Takeuchi, Chino (JP)

(73) Assignee: Seiko Epson Corporation (JP)

( * ) Notice: Subject to any disclaimer, the term of this patent is extended or adjusted under 35 U.S.C. 154(b) by 104 days.

(21) Appl. No.: 13/348,905

(22) Filed: Jan. 12, 2012

(65) Prior Publication Data

US 2012/0181666 A1 Jul. 19, 2012

(30) Foreign Application Priority Data

Jan. 13, 2011 (JP) ................................ 2011-004597

(51) Int. Cl.
*H01L 21/44* (2006.01)
*H01L 23/04* (2006.01)

(52) U.S. Cl.
USPC ............................ 438/113; 438/460; 257/730

(58) Field of Classification Search
USPC ........... 438/113, 114, 68, 458, 460, 462, 464; 257/730, 773
See application file for complete search history.

(56) References Cited

U.S. PATENT DOCUMENTS 5,968,382 A 10/1999 Matsumoto et al.
6,448,153 B2 9/2002 Siniaguine et al.
6,498,074 B2 12/2002 Siniaguine et al.
7,306,744 B2 12/2007 Matsuo et al.
7,871,901 B2 1/2011 Arita et al.
7,955,893 B2 * 6/2011 Feng et al. .................... 438/106
8,012,805 B2 9/2011 Arita et al.
8,026,181 B2 9/2011 Arita et al.
2007/0262420 A1 11/2007 Arita
2008/0150087 A1 * 6/2008 Farooq et al. ................. 257/620
2009/0098712 A1 * 4/2009 Taguchi et al. ............... 438/462
2009/0194880 A1 * 8/2009 Feng et al. .................... 257/771

FOREIGN PATENT DOCUMENTS

JP 09-029472 2/1997
JP 2003-521120 7/2003
JP 2004-103738 4/2004
JP 2005-349592 12/2005
JP 2006-294688 10/2006
JP 2006-295066 10/2006
JP 2006-295067 10/2006
JP 2006-303077 11/2006
JP 2008-529258 7/2008

* cited by examiner

*Primary Examiner* — Kevin M Picardat

(74) *Attorney, Agent, or Firm* — Harness, Dickey & Pierce, P.L.C.

(57) ABSTRACT

A silicon device has a flat panel shape which is a polygon in a plan view, and at least one corner of the polygon includes two sides adjacent to each other out of plural sides of the polygon and a corner curve portion connected to the two sides so as to connect the two sides.

10 Claims, 6 Drawing Sheets

SILICON DEVICE AND SILICON DEVICE MANUFACTURING METHOD

BACKGROUND

1. Technical Field

The present invention relates to a silicon device including a silicon substrate and a silicon device manufacturing method of manufacturing the silicon device.

2. Related Art

Silicon devices manufactured by processing a silicon substrate have been known. Since a silicon device can be manufactured through the use of the same process as a semiconductor device manufacturing process, minute patterns can be precisely formed. Such a silicon device has a minute structure, but there is a need for an increase in minuteness and a decrease in size.

By using a method of forming plural silicon devices on a silicon wafer and dividing the silicon wafer into individual silicon device chips when manufacturing a silicon device, small-sized silicon devices can be efficiently manufactured.

JP-A-2005-349592 discloses a nozzle plate manufacturing method which can achieve a decrease in thickness of a nozzle plate formed of silicon while preventing the nozzle plate from cracking.

However, silicon devices divided into individual chips are often treated in a chip state. The silicon devices often come to the market in the chip state. On the other hand, in a silicon device having such a size as to be treated as a simple body, the decrease in size accompanies a decrease in strength, which is a phenomenon that it is difficult to avoid in material mechanics. Particularly, the corners of the external shape of a silicon device are parts which can easily break or crack. That is, there is a problem in that the possibility of damaging a silicon device increases due to the breaking or cracking by treating the silicon device in a chip state.

SUMMARY

An advantage of some aspects of the invention is to solve at least a part of the problems described above, and the invention can be embodied as the following forms or application examples.

Application Example 1

This application example of the invention is directed to a silicon device having a flat panel shape which is a polygon in a plan view, wherein at least one corner of the polygon includes two sides adjacent to each other out of plural of sides of the polygon and a corner curve portion connected to the two sides so as to connect the two sides.

In the silicon device according to this application example, each corner includes two adjacent sides and the corner curve portion connected to the two sides. That is, the corner is rounded. In general, an angular corner can easily break or crack when it collides with another member or the like. By rounding the angular part of the corner, it is possible to suppress breaking or cracking of the corner.

Application Example 2

This application example of the invention is directed to a silicon device having a flat panel shape which is a polygon in a plan view, wherein at least one corner of the polygon includes two sides adjacent to each other out of a plurality of sides of the polygon and a connecting line portion connected to the two sides, and the angle of the silicon device at a connection point between one side and the corresponding connecting line portion is obtuse.

In the silicon device according to this application example, each corner includes two adjacent sides and the connecting line portion connected to the two sides and the angle of the silicon device at the connection point between the side and the connecting line portion is obtuse. That is, the corner is, for example, chamfered. In general, an angular corner can easily break or crack when it collides with another member or the like. By chamfering the angular part of the corner, it is possible to suppress breaking or cracking of the corner.

Application Example 3

In the silicon device according to the above application example, it is preferred that at least one side includes a side-center portion and a side-end portion, the side-end portion is a depressed portion in which the silicon device is depressed with respect to the side-center portion in a plan view, and the side-end portion of the side is connected to the corner curve portion or the connecting line portion.

In the silicon device according to this application example, the side-end portion is a depressed portion in which the silicon device is depressed with respect to the side-center portion in a plan view and the side-end portion is connected to the corner curve portion or the connecting line portion. By employing this shape, it is possible to suppress collision of the corner with another member.

When the silicon devices are arranged, a gap corresponding to the step difference between the side-center portion and the side-end portion in a plan view is present between the corner and another silicon device. When processing the shape of the silicon devices partitioned and formed in the substrate, it is possible to suppress an influence of the corner on the corner of a silicon device adjacent to the silicon device in process due to the gap.

Application Example 4

In the silicon device according to the above application example, it is preferred that at least one side includes a central depressed portion, and the central depressed portion is a depressed portion which is formed at a position separated from the corner curve portion or the connecting line portion and in which the silicon device is depressed with respect to the other portion of the side in a plan view.

In the silicon device according to this application example, the central depressed portion in which the silicon device is depressed with respect to the other portion of the side in a plan view is formed at a position separated from the corner. When the silicon devices are arranged, a gap corresponding to the step difference between the central depressed portion and the other portion of the side in a plan view is present between the central depressed portion and a silicon device adjacent to the side. When processing the shape of the silicon devices partitioned and formed in the substrate, it is possible to suppress an influence of the corner on the central depressed portion of a silicon device adjacent to the silicon device in process due to the gap. By forming the central depressed portion in a part, which faces the corner of one silicon device out of two adjacent silicon devices, of the other silicon device, it is possible to suppress an influence on the other silicon device when processing the corner of one silicon device.

Application Example 5

This application example of the invention is directed to a silicon device manufacturing method of manufacturing a silicon device having a flat panel shape which is a polygon in a plan view, including: forming corners of the polygon by forming through-holes in a device mother substrate in which a plurality of silicon devices are partitioned and formed; and dividing the device mother substrate into the silicon devices.

In the silicon device manufacturing method according to this application example, the shape of the corner of the silicon device is formed by forming a through-hole in the device mother substrate in the forming of the corners. Since the corners are formed as the result of formation of linear sides when processing the shape of the silicon devices partitioned and formed in the device mother substrate, the shape of the corners is often angular. By forming the corners by forming through-holes, the planar shape of the corners can be set to any shape. For example, the corners may be rounded or chamfered.

Application Example 6

In the silicon device manufacturing method according to the above application example, it is preferred that at least one corner of the polygon of the respective silicon devices includes two sides adjacent to each other out of a plurality of sides of the polygon and a corner curve portion connected to the two sides so as to connect the two sides, and the corner curve portion is formed in the forming of the corners.

In the silicon device manufacturing method according to this application example, each corner of the silicon device includes two adjacent sides and the corner curve portion connected to the two sides. That is, the corner is rounded. In general, an angular corner can easily break or crack when it collides with another member or the like. By rounding the angular part of the corner, it is possible to suppress breaking or cracking of the corner. In the forming of the corners of forming the corners by forming the through-holes, the planar shape of the corners can be set to any shape by forming the corners by forming through-holes. By forming the corner curve portion in the forming of the corners, the corner curve portion can be easily formed in any shape.

Application Example 7

In the silicon device manufacturing method according to the above application example, it is preferred that at least one corner of the polygon includes two sides adjacent to each other out of a plurality of sides of the polygon and a connecting line portion connected to the two sides, the angle of the silicon device at a connection point between one side and the corresponding connecting line portion is obtuse, and the connecting line portion is formed in the forming of the corners.

In the silicon device manufacturing method according to this application example, each corner of the device includes two adjacent sides and the connecting line portion connected to the two sides and the angle of the silicon device at the connection point between the side and the connecting line portion is obtuse. That is, the corner is, for example, chamfered. In general, an angular corner can easily break or crack when it collides with another member or the like. By chamfering the angular part of the corner, it is possible to suppress breaking or cracking of the corner. In the forming of the corners of forming the corners by forming the through-holes, the planar shape of the corners can be set to any shape by forming the corners by forming through-holes. By forming the connecting line portion in the forming of the corners, the connecting line portion can be easily formed in any shape.

Application Example 8

In the silicon device manufacturing method according to the above application example, it is preferred that at least one side includes a side-center portion and a side-end portion, the side-end portion is a depressed portion in which the silicon device is depressed with respect to the side-center portion in a plan view, the side-end portion of the side is connected to the corner curve portion or the connecting line portion, and the side-end portion is formed in the forming of the corners.

In the silicon device manufacturing method according to this application example, the side-end portion of the silicon device is a depressed portion in which the silicon device is depressed with respect to the side-center portion in a plan view and the side-end portion is connected to the corner curve portion or the connecting line portion. By employing this shape, it is possible to suppress collision of the corner with another member. When the silicon devices are arranged, a gap corresponding to the step difference between the side-center portion and the side-end portion in a plan view is present between the corner and another silicon device. When processing the shape of the silicon devices partitioned and formed in the substrate, it is possible to suppress an influence of the corner on the corner of a silicon device adjacent to the silicon device in process due to the gap.

In the forming of the corners of forming the corners by forming the through-holes, the planar shape of the corners can be set to any shape by forming the corners by forming through-holes. By forming the connecting line portion in the forming of the corners, the connecting line portion can be easily formed in any shape.

Application Example 9

In the silicon device manufacturing method according to the above application example, it is preferred that at least one side includes a central depressed portion, the central depressed portion is a depressed portion which is formed at a position separated from the corner curve portion or the connecting line portion and in which the silicon device is depressed with respect to the other portion of the side in a plan view, and the forming of the corners includes forming the central depressed portion by forming a through-hole in the device mother substrate.

In the silicon device manufacturing method according to this application example, the central depressed portion in which the silicon device is depressed with respect to the other portion of the side in a plan view is formed at a position separated from the corner. When the silicon devices are arranged, a gap corresponding to the step difference between the central depressed portion and the other portion of the side in a plan view is present between the central depressed portion and a silicon device adjacent to the side. When processing the shape of the silicon devices partitioned and formed in the substrate, it is possible to suppress an influence of the corner on the central depressed portion of a silicon device adjacent to the silicon device in process due to the gap. By forming the central depressed portion in a part, which faces the corner of one silicon device out of two adjacent silicon devices, of the other silicon device, it is possible to suppress an influence on the other silicon device when processing the corner of one silicon device.

In the forming of the corners of forming the corners by forming the through-holes, the planar shape of the corners can be set to any shape by forming the corners by forming through-holes. By forming the central depressed portion in the forming of the corners, the central depressed portion can be easily formed in any shape.

Application Example 10

In the silicon device manufacturing method according to the above application example, it is preferred that the through-holes are formed through the use of a silicon dry-etching process in the forming of the corners.

In the silicon device manufacturing method according to this application example, the corners are formed through the use of the silicon dry-etching process. In general, the dry etching process can form a precise shape. By forming the corners through the use of the dry etching process, the planar shape of the corners can be easily set to any shape. The dry etching process is often used to form functional parts of a silicon device. In this case, by together forming the through-holes in the forming of the functional parts of the silicon device, it is possible to shorten the process time. The functional parts of the silicon device are, for example, ejection nozzle holes in an ejection nozzle plate.

Application Example 11

It is preferred that the silicon device manufacturing method according to the above application example further includes: reducing the thickness of at least parts of the device mother substrate, in which the silicon devices are formed, up to a predetermined thickness, and the forming of the corners includes forming a through-hole depressed portion in a substrate surface of the device mother substrate and removing the bottom of the through-hole depressed portion through the use of the reducing of the thickness to form the through-holes.

In the silicon device manufacturing method according to this application example, the forming of the corners includes forming a through-hole depressed portion in a substrate surface of the device mother substrate and removing the bottom of the through-hole depressed portion through the use of the reducing of the thickness to form the through-hole. Accordingly, the forming of the through-hole depressed portion can employ a device mother substrate with a large thickness and with a large strength not subjected yet to the reducing of the thickness as an object to be processed. Since the removing of the bottom of the through-hole depressed portion to form the through-holes is a process of removing the bottom of the through-hole depressed portion through the use of the reducing of the thickness, the depth of the through-hole depressed portion has only to be greater than the thickness of the silicon device and it is thus possible to reduce the necessary process load, compared with the case where the through-holes are formed in the device mother substrate not subjected yet to the reducing of the thickness.

Application Example 12

It is preferred that the silicon device manufacturing method according to the above application example further includes reducing the thickness of at least parts of the device mother substrate, in which the silicon devices are formed, up to a predetermined thickness, and the forming of the corners includes forming a through-hole depressed portion in a substrate surface of the device mother substrate, reducing the thickness of the bottom of the through-hole depressed portion through the reducing of the thickness, and forming a hole in the bottom, of which the thickness is reduced through the reducing of the thickness of the bottom, from the opposite side of the through-hole depressed portion to form the through-hole.

In the silicon device manufacturing method according to this application example, the forming of the corners includes forming a through-hole depressed portion in a substrate surface of the device mother substrate, reducing the thickness of the bottom of the through-hole depressed portion through the use of the reducing of the thickness, and forming the through-holes. Accordingly, the forming of the through-hole depressed portion can employ a device mother substrate with a large thickness and with a large strength not subjected yet to the reducing of the thickness as an object to be processed.

The through-holes are formed through the use of the forming of the through-hole depressed portion and the forming of the hole in the bottom of the through-hole depressed portion from the opposite side of the through-hole depressed portion. By forming the through-holes through the processing from both sides, it is possible to precisely form the shape of the opening of the through-holes.

Application Example 13

In the silicon device manufacturing method according to the above application example, it is preferred that the dividing of the device mother substrate includes irradiating boundaries between the silicon devices partitioned and formed in the device mother substrate with a laser beam to form an internal modified layer.

In the silicon device manufacturing method according to this application example, the internal modified layer is formed at the boundaries between the silicon devices through the use of the irradiating with a laser beam. The internal modified layer is a layer which can be easily separated by applying a force to the internal modified layer in the direction in which both sides of the internal modified layer are separated from each other. When a grinding blade is used, it is not necessary to provide a necessary grinding (cutting) allowance and it is possible to effectively use the device mother substrate. It is possible to easily form the internal modified layer at any position of the device mother substrate in the in-plane direction. Accordingly, it is not necessary to consider the restriction depending on a dividing method and it is possible to efficiently set the formation position of the silicon device on the device mother substrate.

Application Example 14

In the silicon device manufacturing method according to the above application example, it is preferred that the dividing of the device mother substrate includes applying a force to the silicon devices partitioned and formed in the device mother substrate in a direction in which the silicon devices are separated from each other in the in-plane direction of the device mother substrate.

In the silicon device manufacturing method according to this application example, the dividing of the device mother substrate includes applying a force to the silicon devices in the direction in which the silicon devices are separated from each other. Accordingly, the force for separating the silicon devices can be applied to the silicon devices formed at arbitrary positions on the device mother substrate. Accordingly, it is not necessary to consider the restriction depending on a dividing method and it is possible to efficiently set the formation position of the silicon device on the device mother substrate.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
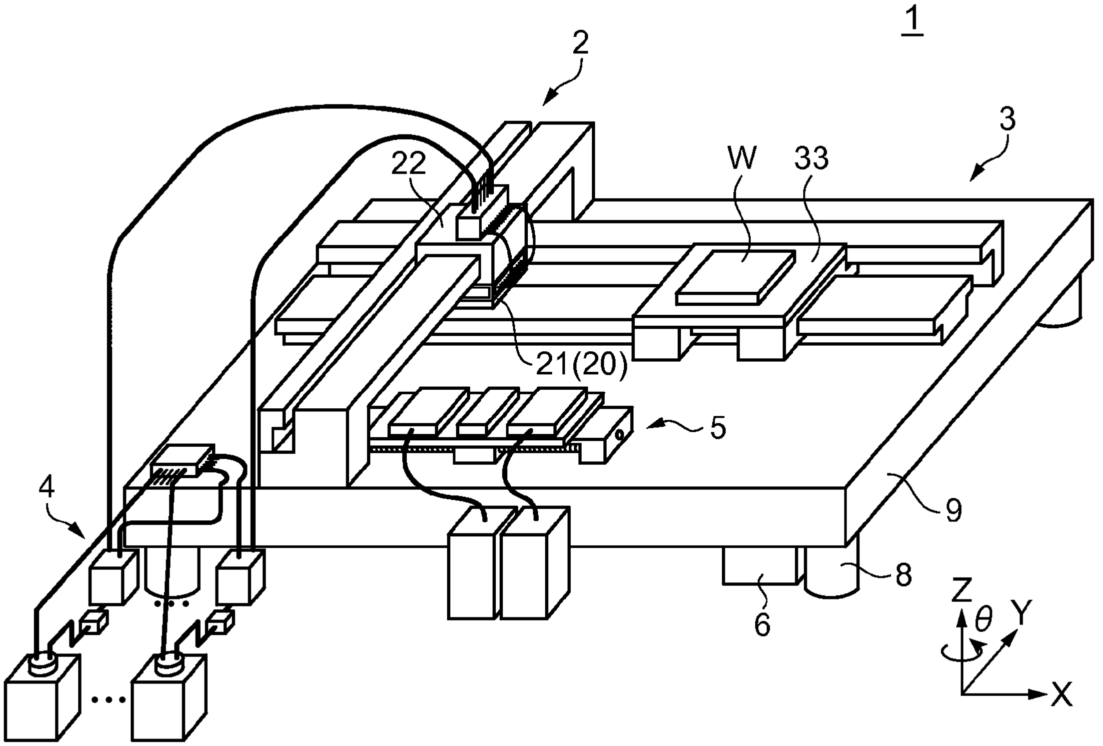
FIG. 1 is an external perspective view schematically illustrating the configuration of a liquid droplet ejecting apparatus.

Hereinafter, a silicon device and a silicon device manufacturing method will be described with reference to the accompanying drawings. In an exemplary embodiment of the invention, a nozzle plate as an example of a silicon device and a nozzle plate manufacturing method will be exemplified. A nozzle plate constitutes a liquid droplet ejecting head and is a substrate in which ejection nozzles ejecting a liquid as a liquid droplet are formed. In the drawings to be referred to in the following description, vertical and horizontal scales of elements or parts are often different from actual ones, for the purpose of drawing convenience.

Liquid Droplet Ejecting Apparatus

First, a liquid droplet ejecting apparatus 1 including a liquid droplet ejecting head 20 having a nozzle plate 25 (see FIGS. 2A to 2C) as an example of a silicon device will be described with reference to FIG. 1. FIG. 1 is an external perspective view schematically illustrating the configuration of a liquid droplet ejecting apparatus.

As shown in FIG. 1, the liquid droplet ejecting apparatus 1 includes a head mechanism unit 2, a work mechanism unit 3, a functional liquid supply unit 4, a maintenance device unit 5, an apparatus control unit 6. The head mechanism unit 2 includes a liquid droplet ejecting head 20 ejecting a functional liquid as liquid droplets. The work mechanism unit 3 includes a work plate 33 on which a work W as an ejection object of the liquid droplets ejected from the liquid droplet ejecting head 20 is placed. The functional liquid supply unit 4 includes a storage tank, a relay tank, and a supply pipe. The supply pipe is connected to the liquid droplet ejecting head 20 and the functional liquid is supplied to the liquid droplet ejecting head 20 via the supply pipe. The maintenance device unit 5 includes devices performing inspection or maintenance of the liquid droplet ejecting head 20. The apparatus control unit 6 controls the mechanism units as a whole. The liquid droplet ejecting apparatus 1 includes plural support legs 8 disposed on a floor and a platen 9 disposed on the support legs 8.

The work mechanism unit 3 is disposed on the surface of the platen 9. The work mechanism unit 3 extends in the length direction (in the X axis direction of the platen 9. The head mechanism unit 2 supported by two support columns fixed to the platen 9 is disposed above the work mechanism unit 3. The head mechanism unit 2 extends in the direction (in the Y axis direction) perpendicular to the work mechanism unit 3. The storage tank and the like of the functional liquid supply unit 4 having a supply pipe communicating with the liquid droplet ejecting head 20 of the head mechanism unit 2 are disposed beside the platen 9. The maintenance device unit 5 is disposed in the vicinity of one support column of the head mechanism unit 2 so as to extend in the X axis direction along with the work mechanism unit 3. The apparatus control unit 6 is disposed below the platen 9.

The head mechanism unit 2 includes a head unit 21 having the liquid droplet ejecting head 20 and a head carriage 22 supporting the head unit 21. By causing the head carriage 22 to move in the Y axis direction, the liquid droplet ejecting head 20 can be made to freely move in the Y axis direction. The liquid droplet ejecting head 20 can be kept at the moved position. The work mechanism unit 3 can cause a work W placed on the work plate 33 to freely move in the X axis direction by causing the work plate 33 to move in the X axis direction. The work plate 33 can be kept at the moved position.

The liquid droplet ejecting head 20 is made to move to an ejection position in the Y axis direction and is stopped at that position and a liquid is ejected as liquid droplets in synchronization with the movement of the work W in the X axis direction. By relatively controlling the work W moving in the X axis direction and the liquid droplet ejecting head 20 moving in the Y axis direction, the liquid droplets can be landed to any position on the work W to drawn a desired image and the like.

Liquid Droplet Ejecting Head

Figure 2A:
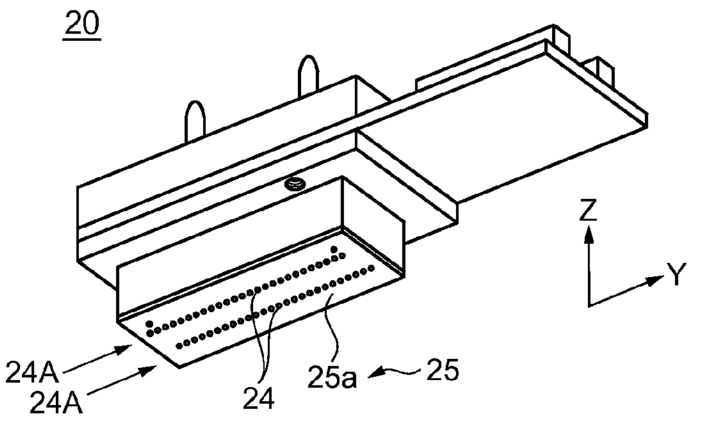
FIG. 2A is an external perspective view illustrating the configuration of a liquid droplet ejecting head.
Figure 2B:
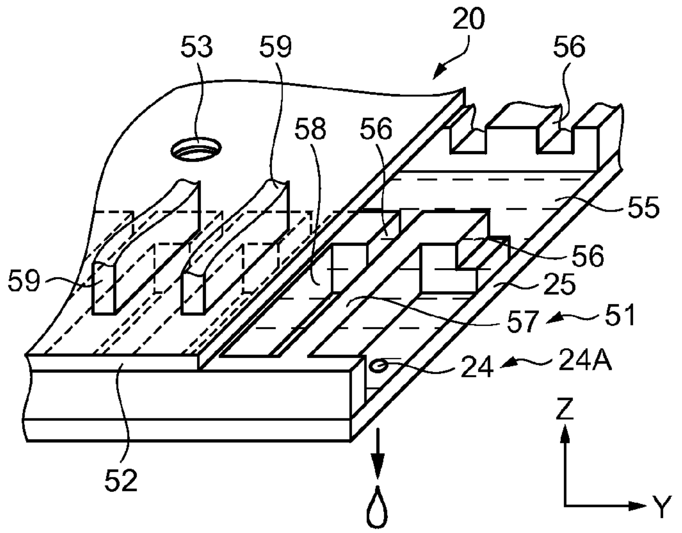
FIG. 2B is a perspective sectional view illustrating the structure of the liquid droplet ejecting head.
Figure 2C:
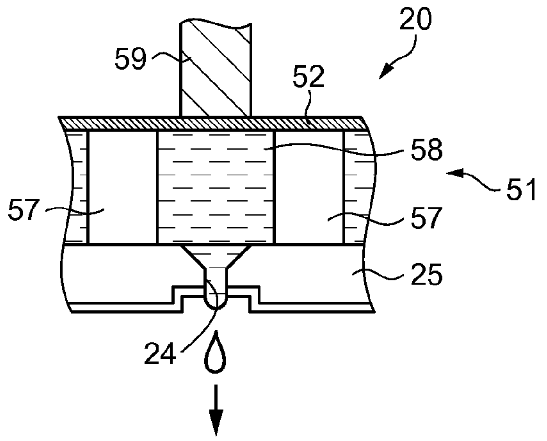
FIG. 2C is a sectional view illustrating the partial structure of an ejection nozzle of the liquid droplet ejecting head.

The liquid droplet ejecting head 20 will be described below with reference to FIGS. 2A to 2C. FIGS. 2A to 2C are diagrams schematically illustrating the configuration of the liquid droplet ejecting head. FIG. 2A is an external perspective view schematically illustrating the configuration of the liquid droplet ejecting head, FIG. 2B is a perspective sectional view illustrating the structure of the liquid droplet ejecting head, and FIG. 2C is a sectional view illustrating the structure of an ejection nozzle of the liquid droplet ejecting head. The Y axis and the Z axis shown in FIGS. 2A to 2C correspond to the Y axis and the Z axis shown in FIG. 1 in the state where the liquid droplet ejecting head 20 is mounted on the liquid droplet ejecting apparatus 1.

As shown in FIG. 2A, the liquid droplet ejecting head 20 includes a nozzle plate 25. Two nozzle lines 24A in which plural ejection nozzles 24 are arranged substantially linearly are formed in the nozzle plate 25. By ejecting the functional liquid as liquid droplets from the ejection nozzles 24 and landing the liquid droplets to a drawing object located to face the ejection nozzles, the functional liquid is arranged at the corresponding positions. The nozzle lines 24A extend in the Y axis direction shown in FIG. 1 in the state where the liquid droplet ejecting head 20 is mounted on the liquid droplet ejecting apparatus 1. The ejection nozzles 24 in the nozzle line 24A are arranged at an identical nozzle pitch and the positions of the ejection nozzles 24 in the two nozzle lines 24A are deviated from each other by a semi nozzle pitch in the Y axis direction. Therefore, the liquid droplets of the functional liquid can be arranged at the semi nozzle pitch in the Y axis direction by the use of the liquid droplet ejecting head 20. In the state where the nozzle plate 25 is mounted on the liquid droplet ejecting head 20, the surface serving as the outer surface of the liquid droplet ejecting head 20 is referred to as a nozzle-formation surface 25*a*.

As shown in FIGS. 2B and 2C, in the liquid droplet ejecting head 20, a pressure chamber plate 51 is stacked on the nozzle plate 25 and a vibration plate 52 is stacked on the pressure chamber plate 51.

A liquid reservoir 55 always filled with the functional liquid to be supplied to the liquid droplet ejecting head 20 is formed in the pressure chamber plate 51. The liquid reservoir 55 is a space surrounded with the vibration plate 52, the nozzle plate 25, and the wall of the pressure chamber plate 51. The functional liquid is supplied to the liquid droplet ejecting head 20 from the functional liquid supply unit 4 and is supplied to the liquid reservoir 55 via the liquid supply hole 53 of the vibration plate 52. A pressure chamber 58 partitioned by plural head partition walls 57 is formed in the pressure chamber plate 51. The space surrounded with the vibration plate 52, the nozzle plate 25, and two head partition walls 57 is the pressure chamber 58.

The pressure chamber 58 is disposed to correspond to each ejection nozzle 24 and the number of pressure chambers 58 is equal to the number of ejection nozzles 24. The functional liquid is supplied to the pressure chamber 58 from the liquid reservoir 55 via the supply holes 56 located between the two head partition walls 57. The set of the head partition wall 57, the pressure chamber 58, the ejection nozzle 24, and the supply hole 56 is arranged in a line along the liquid reservoir 55. The ejection nozzles 24 arranged in a line form the nozzle line 24A. Although not shown in FIG. 2B, the ejection nozzles 24 arranged in a line form another nozzle line 24A above the substantially symmetric position of the nozzle line 24A including the shown ejection nozzles 24 about the liquid reservoir 55. The sets of the head partition wall 57, the pressure chamber 58, and the supply hole 56 corresponding to the nozzle line 24A are arranged in a line.

An end of each piezoelectric element 59 is fixed to a part of the vibration plate 52 constituting the pressure chamber 58. The other end of the piezoelectric element 59 is fixed to a base (not shown) supporting the overall liquid droplet ejecting head 20 with a fixing plate (not shown) interposed therebetween.

The piezoelectric element 59 includes an active portion in which an electrode layer and a piezoelectric material are stacked. By applying a driving voltage to the electrode layer of the piezoelectric element 59, the length of the active portion is reduced in the length direction (in the thickness direction of the vibration plate 52 in FIG. 2B or 2C). By stopping the application of the driving voltage to the electrode layer, the active portion is returned to the original length.

By applying the driving voltage to the electrode layer to reduce the length of the active portion of the piezoelectric element 59, an attractive force directed to the opposite side of the pressure chamber 58 acts on the vibration plate 52 to which an end of the piezoelectric element 59 is fixed. Since the vibration plate 52 is attracted to the opposite side of the pressure chamber 58, the vibration plate 52 is bent to the opposite side of the pressure chamber 58. Accordingly, since the volume of the pressure chamber 58 increases, the functional liquid is supplied to the pressure chamber 58 from the liquid reservoir 55 via the supply hole 56. When the application of the driving voltage to the electrode layer is stopped, the active portion is returned to the original length and thus the piezoelectric element 59 presses the vibration plate 52. The vibration plate 52 is returned toward the pressure chamber 58 by the pressing. Accordingly, the volume of the pressure chamber 58 is rapidly returned to the original state. That is, since the increasing volume decreases, the functional liquid filled in the pressure chamber 58 is pressurized and the functional liquid is thus ejected as liquid droplets from the ejection nozzle 24 communicating with the corresponding pressure chamber 58.

Nozzle Plate and Mother Nozzle Plate

The nozzle plate 25 and the mother nozzle plate 25A will be described below with reference to FIGS. 3A and 3B. The nozzle plate 25 is manufactured in the form of a mother nozzle plate 25A in which plural nozzle plates 25 are partitioned and formed.

Figure 3A:
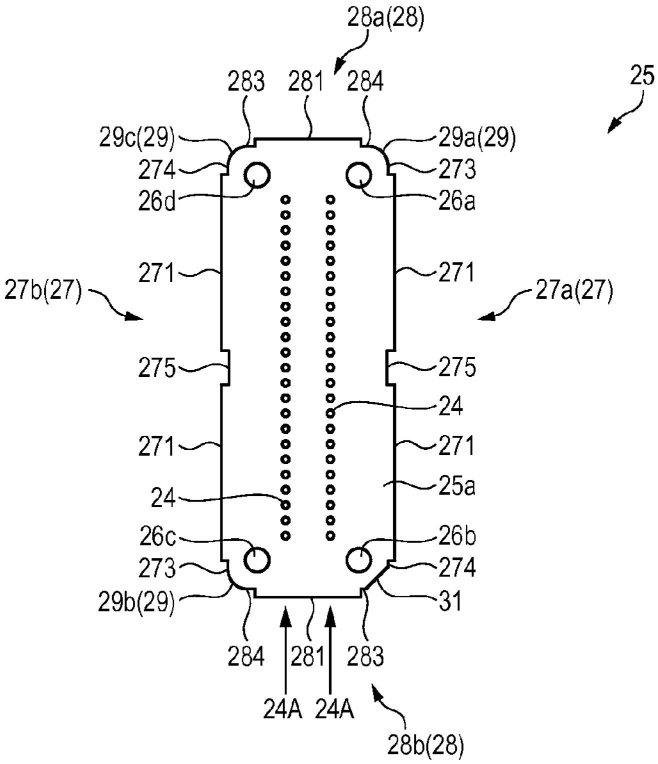
FIG. 3A is a plan view illustrating the planar shape of an individual nozzle plate and FIG. 3B is a plan view illustrating the planar shape of a mother nozzle plate and the arrangement of nozzle plates to be partitioned and formed.
Figure 3B:
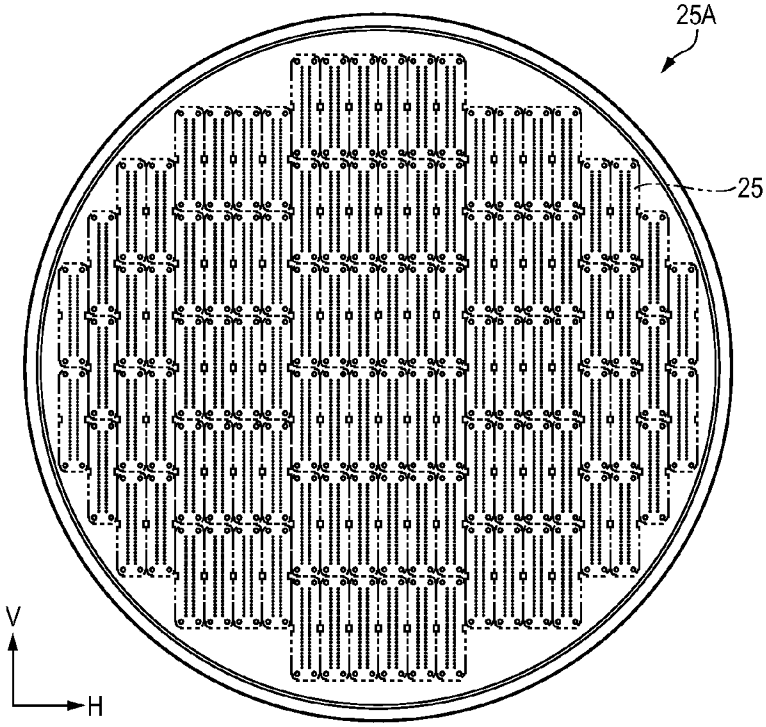

FIGS. 3A and 3B are diagrams illustrating the schematic configuration of the nozzle plate and the mother nozzle plate. FIG. 3A is a plan view illustrating the planar shape of an individual nozzle plate and FIG. 3B is a plan view illustrating the planar shape of the mother nozzle plate and the arrangement of the nozzle plates partitioned and formed therein.

As shown in FIG. 3A, the nozzle plate 25 is a plate-like member of which the planar shape is substantially rectangular. In the nozzle plate 25, two nozzle lines 24A in which plural ejection nozzles 24 are arranged substantially in a line in a substantially rectangular plate are formed. As described above, the nozzle-formation surface 25*a* shown in FIG. 3A is a surface which is the outer surface of the liquid droplet ejecting head 20 in the state where the nozzle plate 25 is mounted on the liquid droplet ejecting head 20. An attachment hole 26*a*, an attachment hole 26*b*, an attachment hole 26*c*, and an attachment hole 26*d* are formed in the vicinity of four corners of the substantially rectangular shape. The attachment holes 26*a*, 26*b*, 26*c*, and 26*d* are holes used to attach the nozzle plate 25 to the pressure chamber plate 51.

Out of four sides of the substantially rectangular shape of the nozzle plate 25, a side extending in a longitudinal direction is referred to as a long side 27 and a side extending in a transverse direction is referred to as a short side 28. Two long sides 27 are referred to as a long side 27*a* and a long side 27*b* and two short sides 28 are referred to as a short side 28*a* and a short side 28*b*. In the plan view shown in FIG. 3A, the short side 28*a*, the long side 27*a*, the short side 28*b*, and the long side 27*b* are arranged sequentially in the clockwise direction.

The long side 27 includes a long-side main portion 271, a long-side end portion 273, and a long-side end portion 274. The long-side end portion 273 and the long-side end portion 274 are connected to both ends of the long-side main portion 271, and the long-side end portion 273 and the long-side end portion 274 are depressed with respect to the long-side main portion 271. A long-side depressed portion 275 is formed at the center of the long-side main portion 271. The long-side depressed portion 275 is depressed with respect to the long-side main portion 271.

The short side 28 includes a short-side main portion 281, a short-side end portion 283, and a short-side end portion 284. The short-side end portion 283 and the short-side end portion 284 are connected to both ends of the short-side main portion 281, and the short-side end portion 283 and the short-side end portion 284 are depressed with respect to the short-side main portion 281.

The long-side end portion 273, the long-side end portion 274, the short-side end portion 283, and the short-side end portion 284 correspond to the side-end portion. The long-side main portion 271 and the short-side main portion 281 correspond to the side-center portion. The long-side depressed portion 275 corresponds to the central depressed portion.

The short side 28*a* and the long side 27*a* are connected to each other via an arc portion 29 by connecting the short-side end portion 284 of the short side 28*a* and the long-side end portion 273 of the long side 27*a* to each other via the arc portion 29*a* (29).

The long side 27*a* and the short side 28*b* are connected to each other via a chamfered portion 31 by connecting the long-side end portion 274 of the long side 27*a* and the short-side end portion 283 of the short side 28*b* via the chambered portion 31.

The short side 28*b* and the long side 27*b* are connected to each other via an arc portion 29 by connecting the short-side end portion 284 of the short side 28*b* and the long-side end portion 273 of the long side 27*b* via the arc portion 29*b* (29).

The long side 27*b* and the short side 28*a* are connected to each other via an arc portion 29 by connecting the long-side end portion 274 of the long side 27*b* and the short-side end portion 283 of the short side 28*a* via the arc portion 29*c* (29).

The arc portion 29 corresponds to the corner curve portion. The chamfered portion 31 corresponds to the connecting line portion.

The nozzle plates 25 are partitioned and formed on the mother nozzle plate 25A and are taken out by dividing the mother nozzle plate 25A. As shown in FIG. 3B, the mother nozzle plate 25A is a circular silicon wafer. 102 nozzle plates 25 are partitioned and formed on the mother nozzle plate 25A.

The direction parallel to the long sides 27 of the nozzle plates 25 partitioned and formed on the mother nozzle plate 25A is referred to as a V axis direction and the direction parallel to the short sides 28 is referred to as an H direction. Six nozzle plates 25 are arranged in the V axis direction at the center in the H axis direction of the mother nozzle plate 25A. In a part in which the size in the V axis direction disables the arrangement of six nozzle plates 25 in the V axis direction, five nozzle plates 25 are arranged in the V axis direction. The positions in the V axis direction of the nozzle plates 25 in the line in which six nozzle plates are arranged in the V axis direction are different from the positions in the V axis direction of the nozzle plates 25 in the line in which five nozzle plates are arranged substantially by a half of the length of each nozzle plate 25 in the V axis direction.

Similarly, the positions in the V axis direction of the nozzle plates 25 in the line in which five nozzle plates are arranged in the V axis direction are different from the positions in the V axis direction of the nozzle plates 25 in the line in which four nozzle plates are arranged substantially by a half of the length of each nozzle plate 25 in the V axis direction. A difference by substantially a half of the length of each nozzle plate 25 in the V axis direction is present between the positions in the V axis direction of the nozzle plates 25 in the line in which four nozzle plates are arranged in the V axis direction and the positions in the V axis direction of the nozzle plates 25 in the line in which three nozzle plates are arranged and between the positions in the V axis direction of the nozzle plates 25 in the line in which three nozzle plates are arranged in the V axis direction and the positions in the V axis direction of the nozzle plates 25 in the line in which two nozzle plates are arranged.

Process of Manufacturing Nozzle Plate

Figure 4:
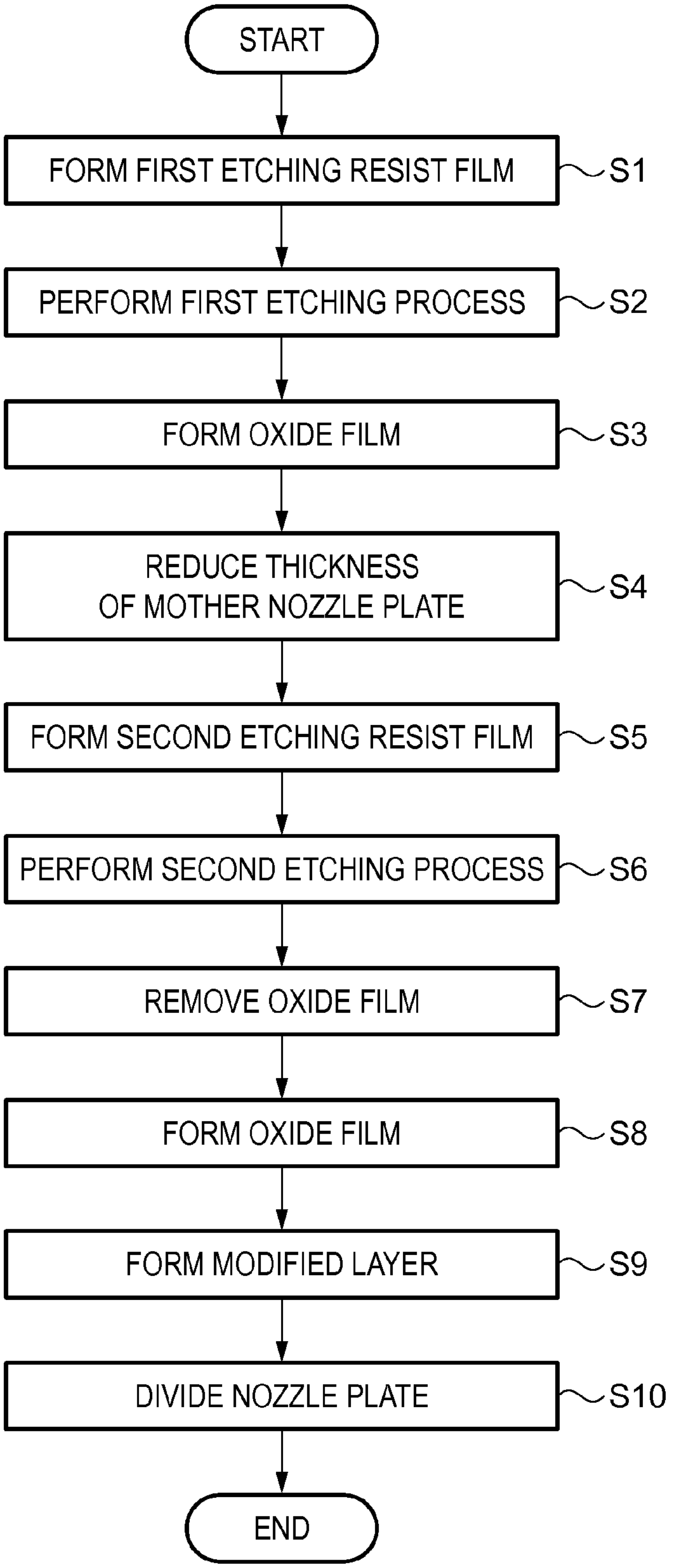
FIG. 4 is a flowchart illustrating the flow of a nozzle plate manufacturing process.

The process of manufacturing a nozzle plate 25 in which the ejection nozzles 24 and the like are formed in the mother nozzle plate 25A and the mother nozzle plate is divided into individual nozzle plates 25 will be described with reference to FIG. 4, FIGS. 5A to 5G, and FIGS. 6A to 6I. FIG. 4 is a flowchart illustrating the process of manufacturing a nozzle plate. FIGS. 5A to 5G are diagrams illustrating a section of the mother nozzle plate in the process of manufacturing a nozzle plate. FIGS. 6A to 6I are diagrams illustrating examples of corner through-holes. Regarding the mother nozzle plate 25A, a plate in a silicon wafer state as a source material, a plate in a state where nozzle plates 25 are being formed, and a plate in a state where nozzle plates 25 which can be divided into the individual nozzle plates 25 are partitioned and formed are all referred to as the mother nozzle plate 25A. The mother nozzle plate 25A corresponds to the device mother plate.

Figures 5A, 5B, 5C, 5D, 5E, 5F, 5G:
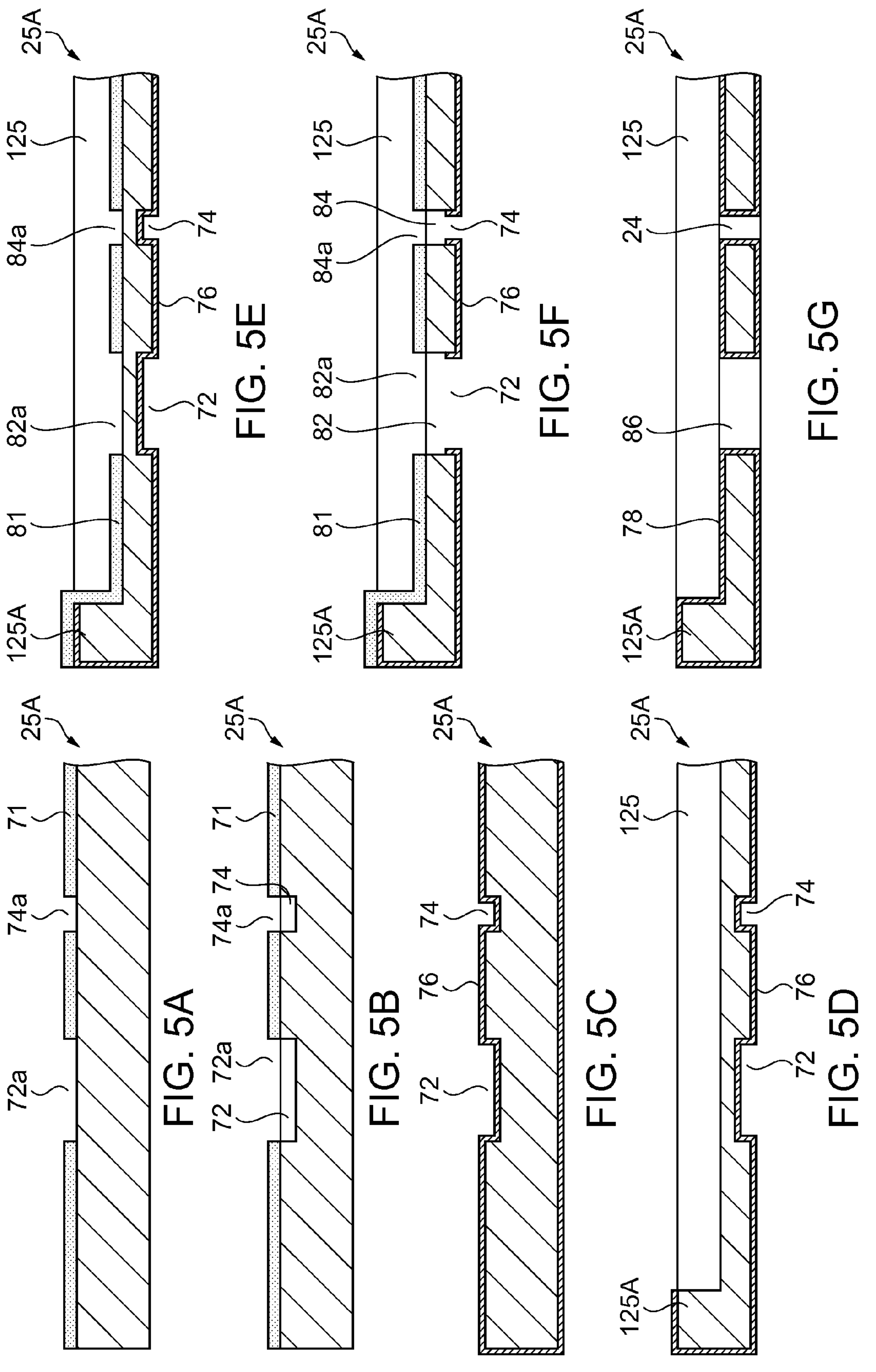
FIGS. 5A to 5G are diagrams illustrating sections of the mother nozzle plate in the nozzle plate manufacturing process.

First, in step S1 of FIG. 4, a first etching resist film 71 is formed. As shown in FIG. 5A, the resist film 71 in which the corner hole openings 72*a*, the nozzle hole opening 74*a*, and the like are formed is formed on the first surface of the mother nozzle plate 25A. The nozzle hole opening 74*a* is an opening formed in the resist film 71 so as to form the ejection nozzle 24. The corner hole opening 72*a* is an opening formed in the resist film 71 so as to form the corner through-hole 86. The corner through hole 86 is a hole formed to form the outer shapes of the short-side end portion 284, the long-side end portion 273, the arc portion 29*a*, the long-side end portion 274, the short-side end portion 283, the chamfered portion 31, the short-side end portion 284, the long-side end portion 273, the arc portion 29*b*, the long-side end portion 274, the short-side end portion 283, the arc portion 29*c*, the long-side depressed portion 275, and the like.

Then, in step S2 of FIG. 4, a first etching is performed. The first etching is, for example, a dry etching. As shown in FIG. 5B, the silicon substrate exposed from the corner hole openings 72*a* or the nozzle hole openings 74*a* of the resist film 71 are etched to form the corner-hole depressed portions 72 or the nozzle hole depressed portions 74. The corner-hole depressed portion 72 is a depressed portion forming a part of the corner through-hole 86. The nozzle-hole depressed portion 74 is a depressed portion forming a part of the ejection nozzle 24. Regarding the etching conditions of the first etching, the conditions for forming the nozzle-hole depressed portions 74 forming a part of the ejection nozzles 24, which requires highest precision, are preferentially determined.

The first etching of forming the corner-hole depressed portions 72 corresponds to the through-hole depressed portion forming step. The corner-hole depressed portion 72 corresponds to the through-hole depressed portion.

In step S3 of FIG. 4, an oxide film 76 is formed by thermal oxidation. The resist film 71 used in the first etching is removed and the oxide film 76 is formed on the entire surface of the mother nozzle plate 25A including the surfaces of corner-hole depressed portions 72 and the nozzle-hole depressed portions 74 as shown in FIG. 5C.

In step S4 of FIG. 4, a thinning step of the mother nozzle plate 25A is performed. The mother nozzle plate 25A introduced into the process of manufacturing a nozzle plate 25 is a silicon wafer having a thickness larger than the predetermined thickness of the nozzle plate 25 so as to give the rigidity thereto. The thinning step is a step of adjusting the thickness of the part in which the nozzle plates 25 should be formed to a predetermined thickness of the nozzle plates 25. As shown in FIG. 5D, by leaving a marginal portion 125A at the edge of the mother nozzle plate 25A to form a thinned depressed portion 125, the thickness of the part in which the nozzle plate 25 should be formed is adjusted to a predetermined thickness of the nozzle plate 25. The thinned depressed portion 125 is formed by grinding the opposite surface of the surface of the mother nozzle plate 25A in which the corner-hole depressed portions 72 and the nozzle-hole depressed portions 74 are formed. The mother nozzle plate 25A in the drawings subsequent to FIG. 5D is shown by turning over the mother nozzle plate 25A in FIGS. 5A to 5C.

The thinning step corresponds to the thickness reducing step.

In step S5 of FIG. 4, a second etching resist film 81 is formed. As shown in FIG. 5E, the resist film 81 in which the corner-hole openings 82*a* and the nozzle-hole openings 84*a* are opened is formed on the surface of the mother nozzle plate 25A including the bottom of the thinned depressed portion 125. The nozzle-hole opening 84*a* is an opening formed in the resist film 81 to form the ejection nozzle 24. The corner-hole opening 82*a* is an opening formed in the resist film 81 to form the corner through-hole 86.

In step S6 of FIG. 4, the second etching is performed. The second etching is, for example, a dry etching. As shown in FIG. 5F, the silicon substrate exposed from the corner-hole openings 82*a* and the nozzle-hole openings 84*a* of the resist film 81 is etched to form the corner-hole penetrated portions and the nozzle-hole penetrated portions 84. The corner-hole penetrated portion 82 is a hole passing from the bottom of the thinned depressed portion 125 to the corner-hole depressed portion 72. The nozzle-hole penetrated portion 84 is a hole passing from the bottom of the thinned depressed portion 125 to the nozzle-hole depressed portion 74.

The second etching of forming the corner-hole penetrated portion 82 corresponds to the hole forming step.

In step S7 of FIG. 4, an oxide film removing step is performed. In the oxide film removing step, the resist film 81 and the oxide film 76 used in the second etching are removed.

In step S8, as shown in FIG. 5G, an oxide film 78 is formed on the entire surface of the mother nozzle plate 25A including the wall surfaces of the corner-hole penetrated portions 82 and the corner-hole depressed portions 72 and the wall surfaces of the nozzle-hole penetrated portions 84 and the nozzle-hole depressed portions 74. The oxide film 78 is formed on the wall surfaces of the corner-hole penetrated portions 82 and the corner-hole depressed portions 72 to form the corner through-holes 86. The oxide film 78 is formed on the wall surfaces of the nozzle-hole penetrated portions 84 and the nozzle-hole depressed portions 74 to form the ejection nozzles 24.

The ejection nozzle 24 shown in FIG. 5G is a cylindrical hole, but the shape of the ejection nozzle 24 can be designed in various forms to perform an appropriate ejection and has, for example, the sectional shape shown in FIG. 2C. To form the ejection nozzle 24 having a complicated sectional shape, a resist film forming step of forming a resist film having different opening sizes, an etching step of performing an isotropic etching, and an etching step of performing an anisotropic etching can be appropriately combined and performed.

The corner through-hole 86 corresponds to the through-hole.

Here, the planar shape of the corner through-hole 86 shown in FIG. 5G will be described with reference to FIGS. 6A to 6I. The mother nozzle plate 25A shown in FIG. 6A is the same as the mother nozzle plate 25A shown in FIG. 3B.

Figure 6A:
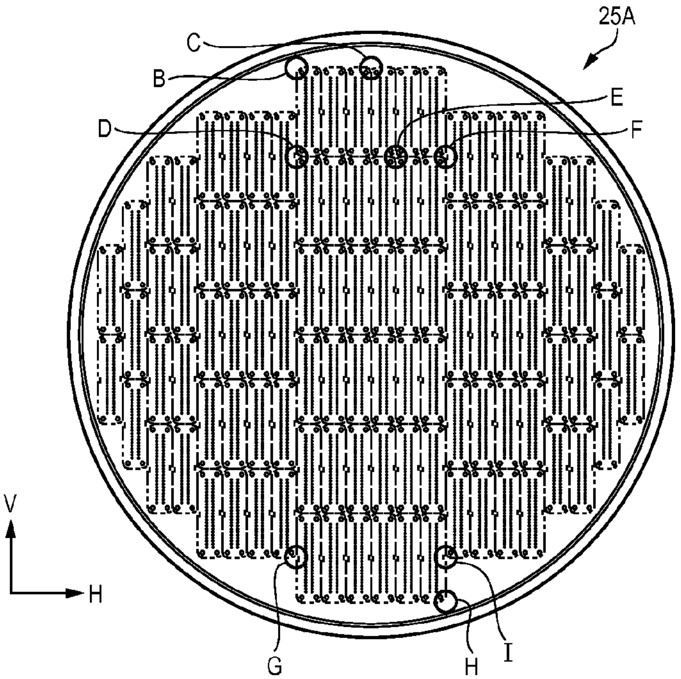
FIGS. 6A to 6I are diagrams illustrating shape examples of a corner through-hole.
Figure 6B:
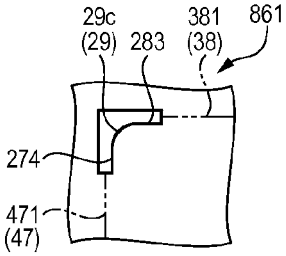

The corner through-hole 861 of which the planar shape is shown in FIG. 6B is a corner through-hole 86 used to form the shape of the corner of the long side 27*b* and the short side 28*a*, as indicated by a circle B in FIG. 6A. The long-side end portion 274 of the long side 27*b*, the short-side end portion 283 of the short side 28*a*, and the arc portion 29*c* of one nozzle plate 25 are formed in the corner through-hole 861. A division line 381 extending from an end in the vicinity of the part serving as the short-side end portion 283 in the H axis direction is a division line 38 in which the divided one side serves as the short-side main portion 281 of the short side 28*a*. A division line 471 extending from an end in the vicinity of the part serving as the long-side end portion 274 in the V axis direction is the division line 47 in which the divided one side serves as the long-side main portion 271 of the long side 27*b*.

Figure 6C:
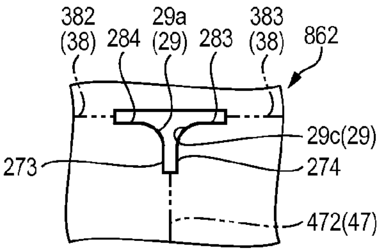

The corner through-hole 862 of which the planar shape is shown in FIG. 6C is a corner through-hole 86 used to form the shape of the corner of the long side 27*b* and the short side 28*a* and the shape of the corner of the short side 28*a* and the long side 27*a*, as indicated by a circle C in FIG. 6A. The long-side end portion 274 of the long side 27*b*, the short-side end portion 283 of the short side 28*a*, and the arc portion 29*c* of one nozzle plate 25 and the short-side end portion 284 of the short side 28*a*, the long-side end portion 273 of the long side 27*a*, and the arc portion 29*a* of one nozzle plate 25 are formed in the corner through-hole 862.

A division line 382 extending from an end in the vicinity of the part serving as the short-side end portion 284 in the H axis direction is a division line 38 in which the divided one side serves as the short-side main portion 281 of the short side 28*a*. A division line 383 extending from an end in the vicinity of the part serving as the short-side end portion 283 in the H axis direction is a division line 38 in which the divided one side serves as the short-side main portion 281 of the short side 28*a*. A division line 472 extending from an end in the vicinity of the part serving as the long-side end portion 273 or the long-side end portion 274 in the V axis direction is the division line 47 in which the divided one side serves as the long-side main portion 271 of the long side 27*a* and the divided one side serves as the long-side main portion 271 of the long side 27*b*.

Figure 6D:
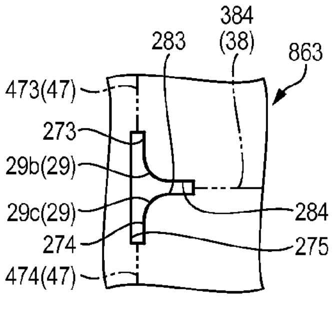

The corner through-hole 863 of which the planar shape is shown in FIG. 6D is a corner through-hole 86 used to form the shape of the corner of the long side 27*b* and the short side 28*a*, the shape of the corner of the short side 28*b* and the long side 27*b*, and the shape of the long-side depressed portion 275 of the long side 27*a*, as indicated by a circle D in FIG. 6A. The long-side end portion 274 of the long side 27*b*, the short-side end portion 283 of the short side 28*a*, and the arc portion 29*c* of one nozzle plate 25, the short-side end portion 284 of the short side 28*b*, the long-side end portion 273 of the long side 27*b*, and the arc portion 29*b* of one nozzle plate 25, and the long-side depressed portion 275 of the long side 27*a* of one nozzle plate 25 are formed in the corner through-hole 863.

A division line 473 extending from an end in the vicinity of the part serving as the long-side end portion 273 in the V axis direction is a division line 47 in which the divided one side serves as the long-side main portion 271 of the long side 27*b* and the divided one side serves as the long-side main portion 271 of the long side 27*a*. A division line 474 extending from an end in the vicinity of the part serving as the long-side end portion 274 in the V axis direction is the division line 47 in which the divided one side serves as the long-side main portion 271 of the long side 27*b* and the divided one side serves as the long-side main portion 271 of the long side 27*a*. A division line 384 extending from an end in the vicinity of the part serving as the short-side end portion 284 or the short-side end portion 283 in the H axis direction is the division line 38 in which the divided one side serves as the short-side main portion 281 of the short side 28*b* and the divided one side serves as the short-side main portion 281 of the short side 28*a*.

Figure 6E:
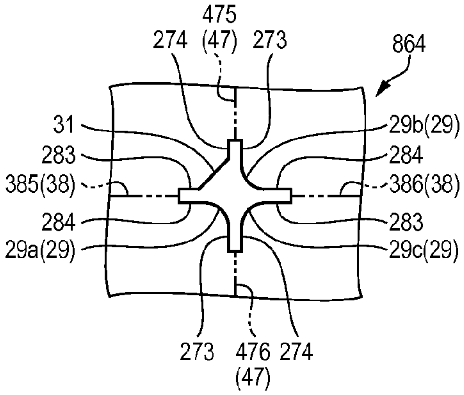

The corner through-hole 864 of which the planar shape is shown in FIG. 6E is a corner through-hole 86 used to form the shapes of four corners of the nozzle plate 25, as indicated by a circle E in FIG. 6A. The long-side end portion 274 of the long side 27*b*, the short-side end portion 283 of the short side 28*a*, and the arc portion 29*c* of one nozzle plate 25 and the short-side end portion 284 of the short side 28*a*, the long-side end portion 273 of the long side 27*a*, and the arc portion 29*a* of one nozzle plate 25 are formed in the corner through-hole 864. The short-side end portion 284 of the short side 28*b*, the long-side end portion 273 of the long side 27*b*, and the arc portion 29*b* of one nozzle plate 25 and the short-side end portion 283 of the short side 28*b*, the long-side end portion 274 of the long-side 27*a*, and the chamfered portion 31 of one nozzle plates 25 are also formed in the corner through-hole 864.

A division line 385 or a division line 386 extending from an end in the vicinity of the part serving as the short-side end portion 284 or the short-side end portion 283 in the H axis direction is the division line 38 in which the divided one side serves as the short-side main portion 281 of the short side 28*b* and the divided one side serves as the short-side main portion 281 of the short side 28*a*. A division line 475 or a division line 476 extending from an end in the vicinity of the part serving as the long-side end portion 273 or the long-side end portion 274 in the V axis direction is the division line 47 in which the divided one side serves as the long-side main portion 271 of the long side 27*a* and the divided one side serves as the long-side main portion 271 of the long side 27*b*.

Figure 6F:
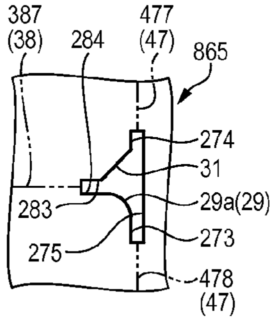

The corner through-hole 865 of which the planar shape is shown in FIG. 6F is a corner through-hole 86 used to form the shape of the corner of the long side 27*a* and the short side 28*b*, the shape of the corner of the short side 28*a* and the long side 27*a*, and the shape of the long-side depressed portion 275 of the long side 27*b*, as indicated by a circle F in FIG. 6A. The long-side end portion 274 of the long side 27*a*, the short-side end portion 283 of the short side 28*b*, and the chamfered portion 31 of one nozzle plate 25, the short-side end portion 284 of the short side 28*a*, the long-side end portion 273 of the long side 27*a*, and the arc portion 29*a* of one nozzle plate 25, and the long-side depressed portion 275 of the long side 27*b* of one nozzle plate 25 are formed in the corner through-hole 865.

A division line 387 extending from an end in the vicinity of the part serving as the short-side end portion 283 or the short-side end portion 284 in the H axis direction is the division line 38 in which the divided one side serves as the short-side main portion 281 of the short side 28*b* and the divided one side serves as the short-side main portion 281 of the short side 28*a*. A division line 477 extending from an end in the vicinity of the part serving as the long-side end portion 274 in the V axis direction is the division line 47 in which the divided one side serves as the long-side main portion 271 of the long side 27*a* and the divided one side serves as the long-side main portion 271 of the long side 27*b*. A division line 478 extending from an end in the vicinity of the part serving as the long-side end portion 273 in the V axis direction is the division line 47 in which the divided one side serves as the long-side main portion 271 of the long side 27*a* and the divided one side serves as the long-side main portion 271 of the long side 27*b*.

Figure 6G:
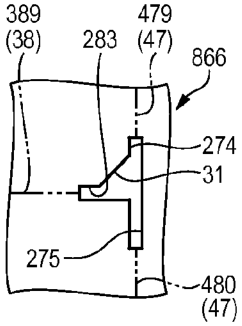

The corner through-hole 866 of which the planar shape is shown in FIG. 6G is a corner through-hole 86 used to form the shape of the corner of the long side 27*a* and the short side 28*b* and the shape of the long-side depressed portion 275 of the long side 27*b*, as indicated by a circle G in FIG. 6A. The long-side end portion 274 of the long side 27*a*, the short-side end portion 283 of the short side 28*b*, and the chamfered portion 31 of one nozzle plate 25 and the long-side depressed portion 275 of the long side 27*b* of one nozzle plate 25 are formed in the corner through-hole 866.

A division line 389 extending from an end in the vicinity of the part serving as the short-side end portion 283 in the H axis direction is the division line 38 in which the divided one side serves as the short-side main portion 281 of the short side 28*b*. A division line 479 extending from an end in the vicinity of the part serving as the long-side end portion 274 in the V axis direction is the division line 47 in which the divided one side serves as the long-side main portion 271 of the long side 27*a* and the divided one side serves as the long-side main portion 271 of the long side 27*b*. A division line 480 extending from the opposite end of the division line 479 in the V axis direction is the division line 47 in which the divided one side serves as the long-side main portion 271 of the long side 27*b*.

Figure 6H:
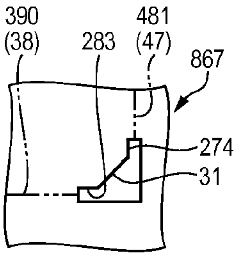

The corner through-hole 867 of which the planar shape is shown in FIG. 6H is a corner through-hole 86 used to form the shape of the corner of the long side 27*a* and the short side 28*b*, as indicated by a circle H in FIG. 6A. The long-side end portion 274 of the long side 27*a*, the short-side end portion 283 of the short side 28*b*, and the chamfered portion 31 of one nozzle plate 25 are formed in the corner through-hole 867.

A division line 390 extending from an end in the vicinity of the part serving as the short-side end portion 283 or the short-side end portion 284 in the H axis direction is the division line 38 in which the divided one side serves as the short-side main portion 281 of the short side 28*b*. A division line 481 extending from an end in the vicinity of the part serving as the long-side end portion 274 in the V axis direction is the division line 47 in which the divided one side serves as the long-side main portion 271 of the long side 27*a*.

Figure 6I:
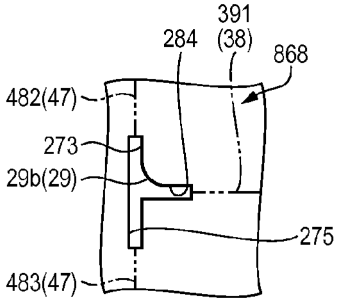

The corner through-hole 868 of which the planar shape is shown in FIG. 6I is a corner through-hole 86 used to form the shape of the corner of the long side 27*b* and the short side 28*b* and the shape of the long-side depressed portion 275 of the long side 27*a*, as indicated by a circle I in FIG. 6A. The long-side end portion 273 of the long side 27*b*, the short-side end portion 284 of the short side 28*b*, and the arc portion 29*b* of one nozzle plate 25 and the long-side depressed portion 275 of the long side 27*a* of one nozzle plate 25 are formed in the corner through-hole 868.

A division line 391 extending from an end in the vicinity of the part serving as the short-side end portion 284 in the H axis direction is the division line 38 in which the divided one side serves as the short-side main portion 281 of the short side 28*b*. A division line 482 extending from an end in the vicinity of the part serving as the long-side end portion 273 in the V axis direction is the division line 47 in which the divided one side serves as the long-side main portion 271 of the long side 27*a* and the divided one side serves as the long-side main portion 271 of the long side 27*b*. A division line 483 extending from the opposite end of the division line 482 in the V axis direction is the division line 47 in which the divided one side serves as the long-side main portion 271 of the long side 27*a*.

In step S9 of FIG. 4, a modified layer is formed in the parts of the division line 38 and the division line 47. A division modified layer is formed in the marginal portion 125A and the like other than the nozzle plates 25 in the mother nozzle plate 25A.

The modified layer is formed by continuously forming modified areas by multi-photon absorption. The multi-photon absorption is caused by irradiating a processing object with a laser beam by the use of a laser processing machine and concentrating the laser beam on the part to be modified. By only applying a slight force, the processing object having the modified areas formed therein can be divided with the modified areas as start points.

In step S10, the mother nozzle plate 25A is divided into chips of the individual nozzle plates 25.

The dividing step includes a tape carrier attaching step, an expansion step, and a separation step. The tape carrier attaching step is a step of attaching the mother nozzle plate 25A having the modified layer formed therein to a flexible tape carrier. The expansion step is a step of dividing the mother nozzle plate 25A attached to the tape carrier into the chips of the individual nozzle plates 25 by applying a two-dimensional tensile force to the tape carrier to two-dimensionally stretch the tape carrier. Since the flexible tape carrier can be stretched but the mother nozzle plate 25A cannot be stretched, the mother nozzle plate 25A is divided at the parts of the division line 38 and the division line 47 in which the modified layer is formed. The separation step is a step of separating the chips of the nozzle plate 25 from the tape carrier.

The process of step S10 is performed and then the process of manufacturing the nozzle plate 25 is ended.

Advantages of the exemplary embodiment will be described below. According to this exemplary embodiment, the following advantages can be obtained.

(1) Three corners of the long sides 27 and the short sides 28 of the nozzle plate 25 include the arc portion 29. Since the corners have a circular arc shape, it is possible to suppress breaking or cracking of the corners when the corners collide with a hard body, compared with the case where the corners are angular.

(2) One corner of the long side 27 and the short side 28 of the nozzle plate 25 includes the chamfered portion 31. Since the corner has a chamfered portion 31, the angle of the corner formed by the chamfered portion 31 and the long side 27 (the long-side end portion 274) or the short side 28 (the short-side end portion 283) is obtuse. Accordingly, compared with the case where the corner has an angle of 90, it is possible to suppress the breaking or cracking of the corners when the corners collide with a hard body.

(3) In the mother nozzle plate 25A, the positions of the nozzle plates 25 in the V axis direction in the line in which six nozzle plates are arranged in the V axis direction and the positions of the nozzle plates 25 in the line in the V axis direction in which five nozzle plates are arranged are different from each other substantially by a half of the length of each nozzle plate 25 in the V axis direction. When the positions of the nozzle plates 25 in the V axis direction are equal to each other, only four nozzle plates 25 can be arranged in the line of the mother nozzle plate 25A in which five nozzle plates are arranged in the V axis direction. By setting the positions of the nozzle plates 25 in the V axis direction to be different from each other, it is possible to obtain the larger number of nozzle plates 25 from a single plate having the same size.

(4) The long-side end portion 273 and the long-side end portion 274 are depressed with respect to the long-side main portion 271, and the short-side end portion 283 and the short-side end portion 284 are depressed with respect to the short-side main portion 281. The planar shape of the corner through-hole 86 is a shape including the depression. Since the sectional area of the corner through-hole 86 increases in comparison with the case where the depression is not formed, it is possible to easily form the corner through-hole 86. When the processing is performed, for example, up to the end of the nozzle plate 25 divided by the division line 475 shown in FIG. 6E in processing the positions of the division line 47 or the division line 38, at least a gap corresponding to the step difference between the short-side end portion 283 and the short-side end portion 284 and the short-side main portion 281 is present with respect to the nozzle plate 25 divided by the division line 476. Accordingly, it is possible to suppress the influence on the neighboring nozzle plates 25 when processing the division line 47 or the division line 38.

(5) The corner through-hole 86 is first formed to divide the mother nozzle plate 25A into the individual nozzle plates 25. The sectional shape of the corner through-hole 86 can be easily set to any shape depending on the shape of the opening formed in the resist film. Accordingly, it is possible to easily form the arc portion 29 or the chamfered portion 31 of the corners.

(6) The long side 27 includes the long-side depressed portion 275 which is depressed with respect to the long-side main portion 271. Even when the processing of the division line 38 is performed, for example, up to the end of the nozzle plate 25 divided by the division line 387 shown in FIG. 6F, at least a gap corresponding to the step difference between the long-side depressed portion 275 and the long-side main portion 271 is present with respect to the long side 27 of the neighboring nozzle plate 25 facing the division line 387. Accordingly, it is possible to suppress the influence on the neighboring nozzle plates 25 deviated in position in the V axis direction when processing the division line 38 of the nozzle plate 25 deviated in position in the V axis direction.

(7) The corner through-hole 86 is formed by forming the corner-hole penetrated portion 82 after the thinning step. The surface ground in the thinning step is the opposite surface of the surface in which the corner-hole depressed portion 72 is formed. Accordingly, it is possible to prevent particles from entering the corner-hole depressed portion 72 (the corner through-hole 86) in the thinning step.

(8) The corner through-hole 86 is formed along with the ejection nozzles 24 in the step of forming the ejection nozzle 24. Accordingly, it is not necessary to separately perform the step of forming the corner through-hole 86 and thus to suppress the increase in the process time of forming the corner through-hole 86.

Since the corner through-hole 86 and the ejection nozzle 24 can be formed by the use of the common resist film 71, it is possible to enhance the relative positional precision between the corner through-hole 86 and the ejection nozzle 24, compared with the case where individual resist films are used to form the corner through-hole 86 and the ejection nozzle 24. That is, it is possible to enhance the relative positional precision of the corner to the ejection nozzle 24.

(9) Out of four corners of the nozzle plate 25, three corners are formed by the arc portion 29 and one corner is formed by the chamfered portion 31. Accordingly, it is possible to identify the posture of the nozzle plate 25 depending on the shapes of the corners.

(10) The mother nozzle plate 25A is divided using the division line 38 and the division line 47 by forming the modified layer in the division line 38 and the division line 47 and performing the expansion step. By forming the modified layer using a laser processing machine, it is possible to start the processing at any position in the in-plane direction of the mother nozzle plate 25A and to easily stop the processing at any position or to easily change the processing direction. Accordingly, even when the nozzle plates 25 in the mother nozzle plate 25A are arranged without matching the ends of the nozzle plates 25 with each other, it is possible to easily form the modified layer in the division line 38 and the division line 47.

While the exemplary embodiment of the invention has been described hitherto with reference to the accompanying drawings, the invention is not limited to the exemplary embodiment. The invention may be modified in various forms without departing from the concept of the invention and may be embodied as follows.

Modification 1

Although it has been stated in the embodiment that the nozzle plate 25 mounted on the liquid droplet ejecting head 20 has been exemplified as the silicon device, the shape of the silicon device or the method of manufacturing the silicon device described in the exemplary embodiment may be applied to the shape or manufacturing method of other silicon devices. Particularly, the above-mentioned shape and manufacturing method can be effectively applied to a device with a reduced thickness. Examples thereof include visible or infrared image sensors, silicon microphones, silicon pressure sensors, silicon gyro sensors, optical devices employing a micro actuator, ultrasonic array devices, components of an ink jet head or a nozzle plate used therein, laser-scanning mirror devices, silicon oscillators or clocks, silicone filters, and μ power-generating devices.

Modification 2

In the long side 27 of the nozzle plate 25 according to the above-mentioned exemplary embodiment, the long-side end portion 273 and the long-side end portion 274 corresponding to the side-end portion are depressed with respect to the long-side main portion 271 corresponding to the side-center portion. In the short side 28, the short-side end portion 283 and the short-side end portion 284 corresponding to the side-end portion are depressed with respect to the short-side main portion 281 corresponding to the side-center portion. However, it is not essential that the side constituting the outline of the silicon device includes the side-center portion and the side-end portion and that the side-end portion is depressed with respect to the side-center portion. The side may have a straight-line shape having no step difference.

Modification 3

Although the long-side 27 of the nozzle plate 25 according to the above-mentioned exemplary embodiment includes the long-side depressed portion 275 corresponding to the central depressed portion, it is not essential that the side constituting the outline of the silicon device includes the central depressed portion. The side may have a straight-line shape having no step difference.

Modification 4

In the above-mentioned exemplary embodiment, the corner through-hole 86 is formed by forming the corner-hole depressed portion 72, performing the thinning step, and then forming the corner-hole penetrated portion 82. However, it is not essential to form the through-hole through the use of plural hole forming steps. The through-hole may be formed through the use of one through-hole forming step by forming a hole having such a length or a depressed portion having such a depth to form the through-hole.

Modification 5

In the above-mentioned exemplary embodiment, the long side 27*a* and the short side 28*b* are formed via the chamfered portion 31 by connecting the long-side end portion 274 of the long side 27*a* and the short-side end portion 283 of the short side 28*b* with the chamfered portion 31 corresponding to the connecting line portion. However, it is not essential that the connecting line portion is formed by chamfering the corner. The angle formed by the side and the connecting line portion may be an angle other than 135 degrees. The connecting line portion is not limited to the straight line, but may be a curve.

Modification 6

In the above-mentioned exemplary embodiment, the mother nozzle plate 25A as the source material has a thickness larger than the thickness of the nozzle plate 25 and the thickness of the nozzle plate 25 is adjusted by performing the thinning step corresponding to the thickness reducing step. However, it is not essential to perform the thickness reducing step. A silicon substrate of which the thickness is adjusted to the thickness of the silicon device may be used as the device mother plate.

Modification 7

In the above-mentioned exemplary embodiment, in the stepped portion between the short-side main portion 281 and the short-side end portion 283 or the short-side end portion 284 in the short side 28 or the stepped portion between the long-side main portion 271 and the long-side end portion 273 or the long-side end portion 274 in the long side 27, the short-side main portion 281 and the short-side end portion 283 or the short-side end portion 284 are connected to each other or the long-side main portion 271 and the long-side end portion 273 or the long-side end portion 274 are connected to each other at the stepped portion substantially perpendicular to the short-side main portion 281 or the long-side main portion 271. However, it is not essential that the shape of the connecting portion of the side-center portion and the side-end portion is not the above-mentioned shape. The side-end portion of one silicon device and the side-end portion of the other silicon device, which are formed adjacent to each other in the device mother plate, may be connected in an arc shape. The stepped portion may be a straight line inclined about the side or may be a curve.

Modification 8

In the above-mentioned exemplary embodiment, the bottom of the long-side depressed portion 275 corresponding to the central depressed portion and the long-side main portion 271 are connected to each other at the stepped portion substantially perpendicular to the bottom of the long-side depressed portion 275 and the long-side main portion 271. However, it is not essential that the shape of the connecting portion of the central depressed portion and the side is the above-mentioned shape. The bottom of the central depressed portion of one silicon device and the bottom of the central depressed portion of the other silicon device or the side-end portion, which are formed adjacent to each other in the device mother plate, may be connected in an arc shape. The stepped portion may be a straight line inclined about the bottom of the central depressed portion or the side or a curve.

Modification 9

In the above-mentioned exemplary embodiment, out of four corners of the nozzle plate 25, three corners include the arc portion 29 corresponding to the corner curve portion and one corner includes the chamfered portion 31 corresponding to the connecting line portion. However, it is not essential that the corner curve portion is formed at three corners and that the connecting line portion is formed at one corner. The number of corners including the corner curve portion or the number of corners including the connecting line portion is not particularly limited. The corner curve portion or the connecting line portion may be formed at all the corners of the silicon device.

Modification 10

In the above-mentioned exemplary embodiment, the arc portion 29*a*, the arc portion 29*b*, and the arc portion 29*c* corresponding to the corner curve portion have substantially the same shape. The long-side end portion 273, the long-side end portion 274, the short-side end portion 283, and the short-side end portion 284 corresponding to the side-end portion continuous from the arc portion 29*a*, the arc portion 29*b*, or the arc portion 29*c* have substantially the same shape. However, it is not essential that the shapes are substantially equal to each other. The shape of the corner curve portion or the side-end portion may vary depending on the corners. By setting the shape of the corner curve portion or the side-end portion to vary depending on the corners, it is possible to identify the corners on the basis of the shapes of the corner curve portion or the side-end portion of the corners.

Modification 11

In the above-mentioned exemplary embodiment, the liquid droplet ejecting head 20 includes two nozzle lines 24A in which plural ejection nozzles 24 are arranged substantially in a line. However, the number of nozzle lines included in the liquid droplet ejecting head is not particularly limited.

The entire disclosure of Japanese Patent Application No. 2011-004597, filed Jan. 13, 2011 is expressly incorporated by reference herein.

What is claimed is:

1. A silicon device having a flat panel shape which is a polygon in a plan view, wherein a first corner of the polygon includes a first two sides connected to each other by a corner curve portion, and a second corner of the polygon includes a second two sides connected to each other by a connecting line portion;

an angle between the connecting line portion and at least one of the second two sides is obtuse;

at least one side of the polygon includes a side-center portion and a side-end portion, the side-end portion is a depressed portion in which the silicon device is depressed with respect to the side-center portion in a plan view, and the side-end portion of the side is connected to the corner curve portion or the connecting line portion.

2. The silicon device according to claim 1, wherein at least one side includes a central depressed portion, and wherein the central depressed portion is a depressed portion which is formed at a position separated from the corner curve portion or the connecting line portion and in which the silicon device is depressed with respect to the other portion of the side in a plan view.

3. A silicon device manufacturing method of manufacturing a silicon device having a flat panel shape which is a polygon in a plan view, comprising:

forming corners of the polygon by forming through-holes in a device mother substrate in which a plurality of silicon devices are partitioned and formed; and dividing the device mother substrate into the silicon devices, wherein at least one corner of the polygon includes a corner curve portion connecting a first two sides of the polygon, the corner curve portion being formed in the forming of the corners, at least another corner of the polygon includes a connecting line portion connecting a second two sides of the polygon, an angle between the connecting line portion and at least one of the second two sides being obtuse, and the connecting line portion is formed in the forming of the corners.

4. The silicon device manufacturing method according to claim 3, wherein at least one side includes a side-center portion and a side-end portion, wherein the side-end portion is a depressed portion in which the silicon device is depressed with respect to the side-center portion in a plan view, wherein the side-end portion of the side is connected to the corner curve portion or the connecting line portion, and wherein the side-end portion is formed in the forming of the corners.

5. The silicon device manufacturing method according to claim 3, wherein at least one side includes a central depressed portion, wherein the central depressed portion is a depressed portion which is formed at a position separated from the corner curve portion or the connecting line portion and in which the silicon device is depressed with respect to the other portion of the side in a plan view, and wherein the forming of the corners includes forming the central depressed portion by forming a through-hole in the device mother substrate.

6. The silicon device manufacturing method according to claim 3, wherein the through-holes are formed through the use of a silicon dry-etching process in the forming of the corners.

7. The silicon device manufacturing method according to claim 3, further comprising:

reducing the thickness of at least parts of the device mother substrate, in which the silicon devices are formed, up to a predetermined thickness, wherein the forming of the corners includes forming a through-hole depressed portion in a substrate surface of the device mother substrate and removing the bottom of the through-hole depressed portion through the use of the reducing of the thickness to form the through-hole.

8. The silicon device manufacturing method according to claim 3, further comprising:

reducing the thickness of at least parts of the device mother substrate, in which the silicon devices are formed, up to a predetermined thickness, wherein the forming of the corners includes forming a through-hole depressed portion in a substrate surface of the device mother substrate, reducing the thickness of the bottom of the through-hole depressed portion through the reducing of the thickness, and forming a hole in the bottom, of which the thickness is reduced through the reducing of the thickness of the bottom, from the opposite side of the through-hole depressed portion to form the through-hole.

9. The silicon device manufacturing method according to claim 3, wherein the dividing of the device mother substrate includes irradiating boundaries between the silicon devices partitioned and formed in the device mother substrate with a laser beam to form an internal modified layer.

10. The silicon device manufacturing method according to claim 3, wherein the dividing of the device mother substrate includes applying a force to the silicon devices partitioned and formed in the device mother substrate in a direction in which the silicon devices are separated from each other in the in-plane direction of the device mother substrate.

* * * * *